United States Patent
Taft et al.

(10) Patent No.: US 8,470,743 B2
(45) Date of Patent: Jun. 25, 2013

(54) COMPOSITE SUPERCONDUCTOR

(76) Inventors: Carlton Anthony Taft, Rio de Janeiro (BR); Gerson Silva Paiva, Rio de Janeiro (BR); Nelson Cesar Chaves Pinto Furtado, Rio de Janeiro (BR)

( * ) Notice: Subject to any disclaimer, the term of this patent is extended or adjusted under 35 U.S.C. 154(b) by 0 days.

(21) Appl. No.: 12/983,228

(22) Filed: Dec. 31, 2010

(65) Prior Publication Data

US 2012/0172231 A1    Jul. 5, 2012

(51) Int. Cl.
  *H01L 39/12*    (2006.01)
(52) U.S. Cl.
  USPC ............................................. 505/122
(58) Field of Classification Search
  USPC ................ 505/122; 428/551, 546, 570, 457, 428/930; 252/519.1, 519.33, 519.34
  See application file for complete search history.

(56) References Cited

U.S. PATENT DOCUMENTS

| | | | | |
|---|---|---|---|---|
| 4,152,386 A | * | 5/1979 | Winter | 264/108 |
| 4,931,427 A | * | 6/1990 | Chien | 505/445 |
| 4,954,481 A | * | 9/1990 | DeReggi et al. | 505/122 |
| 5,177,056 A | * | 1/1993 | Hilti et al. | 505/122 |
| 5,312,805 A | * | 5/1994 | Ueba et al. | 549/1 |
| 5,504,138 A | * | 4/1996 | Jacobs | 524/496 |
| 5,540,981 A | * | 7/1996 | Gallagher et al. | 428/220 |
| 6,630,427 B2 | * | 10/2003 | Dunand | 505/452 |
| 6,718,152 B2 | * | 4/2004 | Geervasi et al. | 399/266 |
| 6,794,339 B2 | | 9/2004 | Wiesmann et al. | |
| 7,097,757 B1 | | 8/2006 | Aldissi | |
| 7,338,921 B2 | | 3/2008 | Abe et al. | |
| 2003/0180029 A1 | * | 9/2003 | Garito et al. | 385/142 |
| 2007/0243124 A1 | * | 10/2007 | Baughman et al. | 423/447.1 |
| 2008/0020137 A1 | * | 1/2008 | Venkataramani et al. | 427/215 |
| 2010/0081573 A1 | | 4/2010 | Dou et al. | |

* cited by examiner

*Primary Examiner* — Colleen Dunn
(74) *Attorney, Agent, or Firm* — Carter, DeLuca, Farrell & Schmidt LLP

(57) ABSTRACT

A composite superconductor and methods of providing same include a superconductor powder dispersed within a conductive polymer matrix.

8 Claims, 1 Drawing Sheet

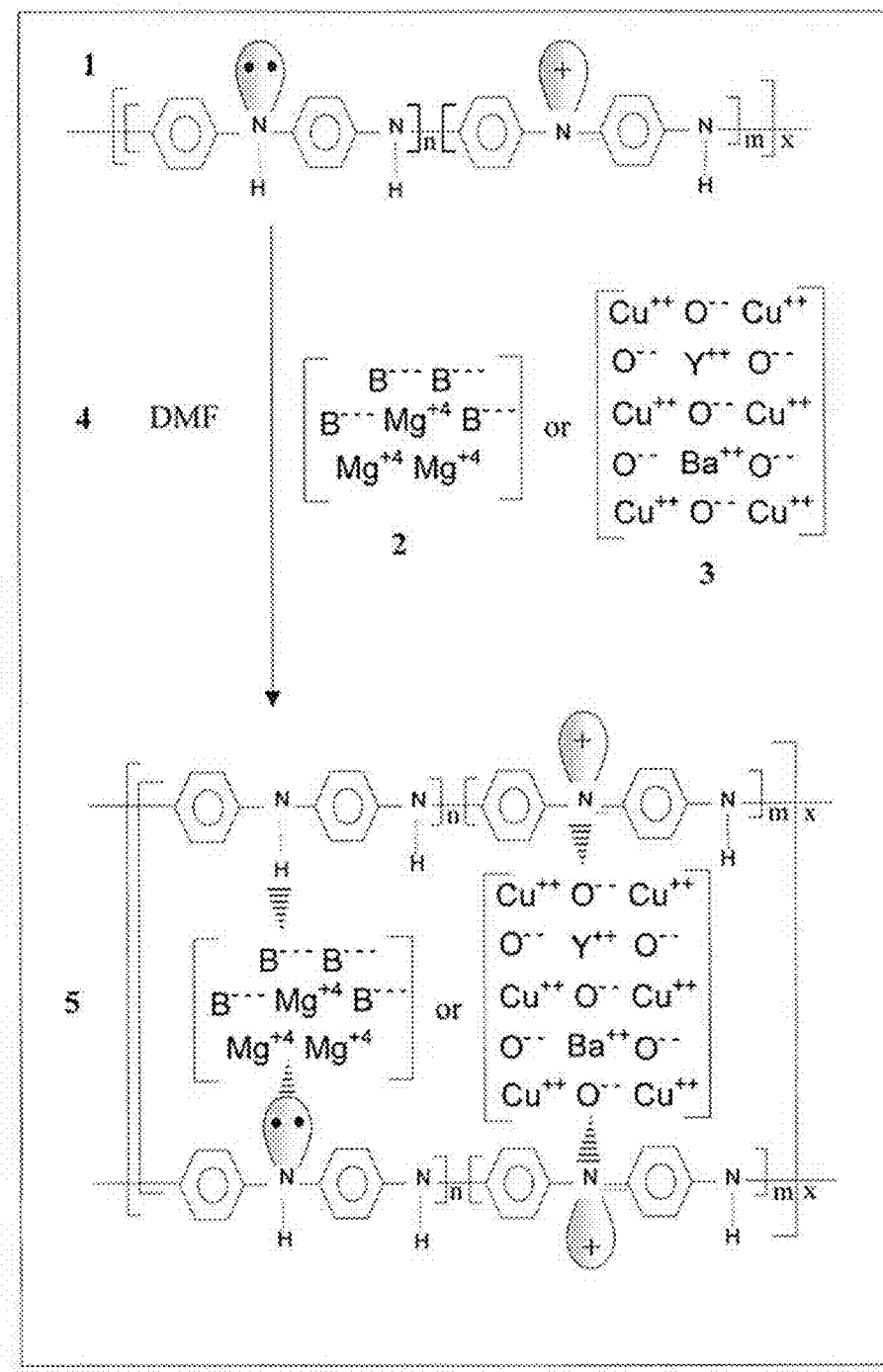

COMPOSITE SUPERCONDUCTOR

TECHNICAL FIELD

The present disclosure relates to a method of forming a composite superconductor and the superconductor composition resulting therefrom. More specifically, the present disclosure relates to a composite superconductor capable of repelling and/or being repelled by permanent magnets due to its intrinsic diamagnetism.

BACKGROUND

Superconductors, whether polymeric or ceramic, are innovative materials capable of intrinsic properties such as levitation and conduction of electrical currents without resistance. These properties are due to the electrons being grouped in Cooper pairs, behaving as bosons.

Typically, mixed metal oxide materials exhibit high-temperature superconductivity as illustrated for example, in U.S. Pat. No. 6,794,339, the entire contents of which is incorporated herein by reference. The rare-earth-metal-alkaline-earth-metal-copper oxide superconductor materials are generally of the formula $RBa_2Cu_3O_7$-x. However, the ceramic nature of the superconductor materials pose a number of problems for the manufacture of high critical temperature ($T_c$) superconducting shaped products such as magnetic levitation components and magnetic shielding devices. Because the mixed oxide superconducting materials are susceptible to degradation by moisture and chemicals such as reducing agents, their use in various applications are limited. In addition, conventional ceramic superconductors are difficult to be molded, easily breakable and thus, difficult to be molded or folded in different forms such as tubes, cylinders, cubes, electric cables and wires, toroids (for use in transformers), train tracks, nucleus for industrial performers, etc.

In contrast, magnesium diboride ($MgB_2$) is a simple, inexpensive ionic binary compound superconducting material. $MgB_2$ has a $T_c$ of 39 K (−234° C.; −389° F.), the highest amongst conventional superconductors, as shown for example, in U.S. Pat. No. 7,338,921, the entire contents of which is incorporated herein by reference. Conventionally, $MgB_2$ is a phonon-mediated superconductor, its electronic structure is such that there exists two types of electrons at the Fermi level with widely differing behaviors, one of them (sigma-bonding) being much more strongly superconducting than the other (pi-bonding). This is at odds with usual theories of phonon-mediated superconductivity which assume that all electrons behave in the same manner.

$MgB_2$ typically only shows competitive properties at relatively low magnetic field values which are useful for biomedical applications such as conductors for MRI magnets. However, the effort and success in improving $MgB_2$ in high magnetic fields remains desirable. Therefore, enhancing the critical current of $MgB_2$ in high magnetic fields such as tracks for levitation trains, tubes and wires, remains one of the main goals to be pursued through the control and manipulation of the structure at a nanometer level to increase flux pinning.

In addition, methods which provide superconductor composite materials that facilitate the cost effective manufacture of high $T_c$ superconducting products of various shapes also remain desirable.

SUMMARY

A superconducting composition is provided which includes at least one conductive polymer; and at least one superconductor material.

A composite superconductor of the present disclosure includes at least one conductive polymer; and at least one superconductor powder.

A composite superconductor may include a matrix formed of a conductive polymer, polyaniline, and a superconductor powder, $MgB_2$ or cuprate superconductor, dispersed in the matrix. In comparison with ceramic superconductors, they indicate high resistance to impact in addition to being light and of easy production and manipulation.

A method of synthesizing a superconductor composition in accordance with the present disclosure is provided which includes the step of combining at least one conductive polymer with at least one superconductor material.

BRIEF DESCRIPTION OF THE DRAWINGS

Various embodiments of the present disclosure will be described herein below with reference to the figures wherein:

FIG. 1 illustrates the process of synthesis of a new composite superconductor in accordance with the present disclosure.

DETAILED DESCRIPTION

The present disclosure relates to a superconducting composition and a method of forming a composite superconductor. The superconducting composition provides for a flexible material which can be easily molded into many shapes due to its form dispersed in a polymeric matrix. The superconducting composition and the process for synthesis of the materials of the present disclosure can significantly increase critical current and flux pinning.

The present disclosure provides a superconducting composition which may include a matrix formed of at least one conductive polymer and at least one superconductor material. In embodiments, the composite superconductor may include a matrix formed of a conductive polymer such as a thermopolymer, and a superconductor powder.

In embodiments, the superconductor material may include $MgB_2$, cuprates and combinations thereof.

In embodiments, the superconducting material may include $MgB_2$. $MgB_2$ may be prepared by applying a negative voltage to an electrode steeped in a solution of magnesium (Mg) and boron (B) so as to precipitate superconductive $MgB_2$ on the electrode. Any acidic solution containing Mg and B, such as a nitric acid solution, a hydrochloric acid solution, a sulfuric acid solution, a carbonic acid solution and a boric acid solution, may be used. The ratio of Mg and B in the solution may be any ratio as long as it does not harm the superconductive property of $MgB_2$ for example, approximately 1:2 that is near the stoichiometric ratio of Mg:B.

In embodiments, the concentration of $MgB_2$ in the solution may be from about 0.25 to about 0.6 mol/L, in other embodiments, about 0.5 to about 0.6 mol/L. In the solution, magnetic elements such as Mn, Fe, Co and Ni may be added so as to improve the superconductive and other properties. Various electrodes may be used, including metal and nonmetal electrodes that conduct electricity and remain chemically stable in the acidic solution. In embodiments, metallic electrodes made of Fe, Co, Ni, Cu, Pd, Ag, Pt, Au and the like may be utilized. In embodiments, nonmetallic electrodes such as graphite, highly-doped silicon, a tin oxide and the like may be utilized.

In embodiments, superconductive $MgB_2$ as a precipitate on an electrode may be obtained by using an electric precipitation method in which an electrode is steeped in the above-mentioned solution and a negative voltage is applied to the electrode.

In embodiments, the superconductor material may include cuprate which includes a copper oxide. The copper oxide may include barium copper oxide, strontium copper oxide, strontium calcium copper oxide, magnesium copper oxide, calcium copper oxide, and derivatives thereof, and combinations thereof. In embodiments, the copper oxide is a barium copper oxide, i.e., $RBa_2Cu_3O_7$-x, wherein R is a rare earth metal and x is less than or equal to 1. In embodiments, the barium copper oxide may include scandium barium copper oxide, yttrium barium copper oxide, lanthanum barium copper oxide, cerium barium copper oxide, praseodymium barium copper oxide, neodymium barium copper oxide, promethium barium copper oxide, samarium barium copper oxide, europium barium copper oxide, gadolinium barium copper oxide, terbium barium copper oxide, dysprosium barium copper oxide, holmium barium copper oxide, erbium barium copper oxide, and derivatives, and combinations thereof. In embodiments, specific examples of cuprates may include $Bi_2Sr_2CuO_6$, $Bi_2Sr_2CaCu_2O_8$, $Bi_2Sr_2Ca_2Cu_3O_6$, $Tl_2Ba_2CuO_6$, $Tl_2Ba_2CaCu_2O_8$, $Tl_2Ba_2Ca_2Cu_3O_{10}$, $TlBa_2Ca_3Cu_4O_{11}$, $HgBa_2CuO_4$, $HgBa_2CaCu_2O_6$, $HgBa_2Ca_2Cu_3O_8$, $YBa_3Cu_4O_x$, $Sn_4Ba_4(Tm_2Ca)Cu_7O_x$, $Sn_6Ba_4Ca_2Cu_{10}O_y$, $(Sn_{1.0}Pb_{0.5}In_{0.5})Ba_4Tm_6Cu_8O_{22+}$, $Sn_6Ba_4Ca_2Cu_{10}O_y$, $(Sn_5In)Ba_4Ca_2Cu_{10}O_y$, $(Tl_4Pb)Ba_2MgCu_8O_{13+}$, $(Tl_4Ba)Ba_2MgCu_8O_{13+}$, $(Tl_4Ba)Ba_2Mg_2Cu_7O_{13+}$, $(Tl_4Ba)Ba_2Ca_2Cu_7O_{13+}$, $(Tl_4Ba)Ba_4Ca_2Cu_{10}O_y$, $Tl_5Ba_4Ca_2Cu_{10}O_y$ and derivatives, and combinations thereof.

In embodiments, the conductive polymer may include polyaniline, poly(N-vinylcarbazole), polyacetylene, polypyrrole, polythiophene, poly(2-vinylpyridine), poly-p-phenylene, poly(p-phenylenevinylene), and derivatives thereof and combinations thereof.

In embodiments, polyaniline may be utilized as the conductive polymer. Polyaniline is an organic polymer which may be converted to a conductive polymer by appropriate oxidations or doping. In its conductive state, polyaniline is green in color (emeraldine), and may change its color and its conductivity on exposure to a variety of medias by changing its oxidation state. Amongst the family of conducting polymers and organic semiconductors, polyaniline is unique due to its case of synthesis, environmental stability, and simple doping chemistry. In comparison with ceramic superconductors, polyaniline has a high resistance to impact, is light and easily manipulated or molded into shape.

Polyaniline may be prepared by mixing aqueous solutions of aniline hydrochloride and ammonium peroxydisulfate at room temperature, followed by the separation of polyaniline hydrochloride precipitate by filtration and drying.

In embodiments, the superconductor material and conductive polymer may be present in a gas, liquid or solid state. In embodiments, the superconductive composition includes a superconductor powder, such as for example, magnesium diboride dispersed in a conductive polymer, such as polyaniline. In embodiments, the superconductor powder and conductive polymer powder may be mixed in an organic solvent such as for example, dimethylformamide, dimethyl sulfoxide, 1-methylpyrrolidone, N-methyl acetamide, hexane, benzene, toluene, 1,4-dioxane, chloroform, tetrahydrofuran, dimethyl sulfoxide and combinations thereof.

The composite superconductor of the present disclosure behaves magnetically as a solid ceramic. The superconductor material dispersed within the conductive polymer has enhanced magnetic properties in relation to traditional ceramics such that Foulcault currents (or parasite currents) which are responsible for great losses in industrial magnetic materials can be minimized to almost zero when they are pulverized within a polymeric matrix.

In embodiments, the superconductor composition may include a thermopolymer. The thermopolymer may include tetrafluoroethylene, hexafluoropropylene, vinylidene fluoride, polyvinylchloride, polyvinylidene chloride, polyvinylacetate, polyvinylalcohol, polyvinylacetals, polymethylmethacrylate, polyethene, polypropylene, polybutylene, polymethylpentene, polyamide, polyester, polyacetal, polycarbonate, styrene-acrylonitrile, acrylonitrile butadiene styrene, cellulose acetate, cyclic olefin copolymer, ethylene-vinyl acetate, ethylene vinyl alcohol, liquid crystal polymer, polyoxymethylene, polyacrylates, polyacrylonitrile, polyamide-imide, polyaryletherketone, polybutadiene, polybutylene terephthalate, polycaprolactone, polychlorotrifluoroethylene, polyethylene terephthala, polycyclohexylene dimethylene terephthalate, polyhydroxyalkanoates, polyketone, polyetheretherketone, polyetherketoneketone, polyetherimide, polyethersulfone, chlorinated polyethylene, polyimide, polylactic acid, polymethylpentene, polyphenylene oxide, polyphenylene sulfide, polyphthalamide, polystyrene, polysulfone, polytrimethylene terephthal, polyurethane, and derivatives and combinations thereof. In embodiments, doping $MgB_2$ with a thermopolymer may improve the upper critical field and the maximum current density.

In embodiments, a method of synthesizing a superconductor composition or a composite superconductor includes combining at least one conductive polymer with at least one superconductor material. In embodiments, the conductive polymer may be mixed with a superconductor powder in an organic solvent, such as for example, dimethylformamide to form a mixture. In embodiments, a thermopolymer may be mixed within the mixture.

In embodiments, the conductive polymer may be utilized in an amount of from about 1 gram to about 10 kilograms, in other embodiments from about 5 grams to about 1 kilogram. In embodiments, the superconducting powder may be utilized in amounts of from about 1 gram to about 5000 grams, in other embodiments from about 5 grams to about 1000 grams.

The solvent may be utilized in embodiments, from about 10 milliliters to about 10 Liters, in other embodiments from about 20 milliliters to about 5000 milliliters.

The thermopolymer may be utilized in an amount of from about 1 gram to about 10 kilograms, in other embodiments from about 10 grams to about 1 kilogram.

In embodiments, the mixture may be stirred at a rate of about 1000 rpm to about 4000 rpm, in other embodiments of from about 2000 rpm to about 3000 rpm at a temperature of about 80° C. to about 120° C., in other embodiments of from about 85° C. to about 110° C. In embodiments, the stirring may occur in an atmosphere of nitrogen for about 24 hours to about 96 hours, in other embodiments of from about 48 hours to about 72 hours.

In embodiments, the composite superconductor may be separated from the solvent by any method known in the art such as for example, centrifugation at about 2000 to about 6000 gravities, in embodiments at about 3000 to about 5000 gravities, for about 30 minutes to about 4 hours, in embodiments, from about 40 minutes to about 2 hours.

In embodiments, superconductivity may be applied at 77 K (−196° C.; −321° F.) in the superconductor materials of the present disclosure in diverse areas of engineering such as train levitation known as Maglev as well as generators such that the loss of mechanical energy can be minimized. In addition, the present disclosure provides for enhancement of critical current of MgB$_2$ in high magnetic fields such as tubes, cylinders, cubes, electric cables and wires, toroids (for use in transformers), train tracks, nucleus for industrial performers, and the like for any superconducting applications.

The composite superconductor of the present disclosure may be shaped into the desired superconducting applications utilizing any method within the purview of those skilled in the art such as for example, injection molding, extrusion coating, blow molding, compression molding, pultrusion, casting, and combinations thereof.

FIG. 1 illustrates the process of synthesis of the composite superconductor. As shown, polyaniline emaraldine salt (1) is mixed with MgB$_2$ (2) or cuprate powder (3) in solvent (4). The end product (5) includes a matrix formed of a conductive polymer, polyaniline, and a superconductor powder, such as MgB$_2$ or cuprate powder, dispersed in the matrix when the solvent is removed from the mixture.

The following Examples are being submitted to illustrate embodiments of the present disclosure. These Examples are intended to be illustrative only and are not intended to limit the scope of the present disclosure.

EXAMPLES

Example 1

A process of synthesizing a thermopolymer composite superconductor is described hereinbelow. About 5 grams of polyaniline emaraldine salt and about 2 grams of MgB$_2$ powder (about 400 Mesh granulometry value) were diluted in about 500 milliliters of dimethylformamide to form a mixture. The mixture was then stirred at a rate of 2000 rpm and at a temperature of about 60° C. in an atmosphere of nitrogen for about 1 hour. The product was separated from the solvent by centrifugation (about 100 gravities) for approximately two hours.

Example 2

A process of synthesizing a thermopolymer composite superconductor is described hereinbelow. About 5 grams of polyaniline emaraldine salt and about 2 grams of cuprate superconductor (RBa$_2$Cu$_3$O$_7$-x) powder (about 400 Mesh granulometry value) were diluted in about 500 milliliters of dimethylformamide to form a mixture. The mixture was then stirred at a rate of 2000 rpm and at a temperature of about 60° C. in an atmosphere of nitrogen for about 1 hour. The product was separated from the solvent by centrifugation (about 100 gravities) for approximately two hours.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method of synthesizing a superconductor composition, comprising:
    combining at least one conductive polymer selected from the group consisting of polyaniline, poly(N-vinylcarbazole), polyacetylene, polypyrrole, polythiophene, poly(2-vinylpyridine), poly-p-phenylene, poly(p-phenylenevinylene), and derivatives and combinations thereof with at least one superconductor material in an organic solvent including dimethylformamide to form a composite, the at least one superconductor material being dispersed in the at least one conductive polymer, wherein the superconductor material comprises magnesium diboride.

2. The method according to claim 1, wherein the conductive polymer comprises polyaniline.

3. The method according to claim 1, further comprising:
    combining a thermopolymer selected from the group consisting of tetrafluoroethylene, hexafluoropropylene, vinylidene fluoride, polyvinylchloride, polyvinylacetate, polyvinylalcohol, polyvinylacetals, polymethylmethacrylate, polyethene, polypropylene, polybutylene, polymethylpentene, polyamide, polyester, polyacetal, polycarbonate and derivatives and combinations thereof.

4. The method according to claim 1, wherein the superconductor material is a powder.

5. The method according to claim 1, wherein the superconductor powder is dispersed in a polymeric matrix.

6. The method according to claim 1, wherein the magnesium diboride is provided in solution at a concentration of from about 0.25 mol/L to about 0.6 mol/L.

7. The method according to claim 1, wherein the at least one conductive polymer is utilized in an amount of from about 1 gram to about 10 kilograms.

8. The method according to claim 1, further comprising:
    stirring the mixture at a rate of about 1000 rpm to about 4000 rpm; and
    removing the organic solvent from the mixture.

\* \* \* \* \*